United States Patent [19]

Shimawaki

[11] Patent Number: 5,321,302
[45] Date of Patent: Jun. 14, 1994

[54] HETEROJUNCTION BIPOLAR TRANSISTOR HAVING BASE STRUCTURE FOR IMPROVING BOTH CUT-OFF FREQUENCY AND MAXIMUM OSCILLATION FREQUENCY

[75] Inventor: Hidenori Shimawaki, Tokyo, Japan

[73] Assignee: NEC Corporation, Japan

[21] Appl. No.: 74,702

[22] Filed: Jun. 8, 1993

Related U.S. Application Data

[63] Continuation of Ser. No. 730,212, Jul. 15, 1991.

[30] Foreign Application Priority Data

Jul. 25, 1990 [JP] Japan ................... 2-197102
Jul. 25, 1990 [JP] Japan ................... 2-197103

[51] Int. Cl.$^5$ .................. H01L 27/082; H01L 27/102; H01L 31/11; H01L 29/167
[52] U.S. Cl. ..................... 257/592; 257/591; 257/593; 257/607
[58] Field of Search ........................ 357/34, 35, 43; 257/591, 591, 593, 607

[56] References Cited

U.S. PATENT DOCUMENTS

| | | | |
|---|---|---|---|
| 5,001,534 | 3/1991 | Lunardi et al. | 257/592 |
| 5,073,812 | 12/1991 | Shimura | 357/34 |
| 5,077,231 | 12/1991 | Plumton et al. | 357/43 |

OTHER PUBLICATIONS

1984 IEEE International Solid-State Circuits Conference, pp. 50, 51.
IEEE Electron Device Letters, vol. 9, No. 8, Aug. 1988, pp. 422-424.
Electronics Letters Sep. 10, 1987 vol. 23, No. 19, pp. 989, 990.
IEEE Transactions on Electron Devices, vol. 36, No. 10, Oct. 1989, pp. 2032-2042.

*Primary Examiner*—Rolf Hille
*Assistant Examiner*—Wael Fahmy
*Attorney, Agent, or Firm*—Laff, Whitesel, Conte, Saret

[57] ABSTRACT

A heterojunction bipolar transistor has an n-type emitter layer of aluminum gallium arsenide and a beryllium doped base layer forming a heterojunction together with the n-type emitter layer, and the base layer is associated with a heavily doped carbon doped base region so that the beryllium content is restricted below the critical value for preventing the emitter layer from undesirable beryllium diffusion.

17 Claims, 13 Drawing Sheets

HETEROJUNCTION BIPOLAR TRANSISTOR HAVING BASE STRUCTURE FOR IMPROVING BOTH CUT-OFF FREQUENCY AND MAXIMUM OSCILLATION FREQUENCY

This application is a continuation of application Ser. No. 07/730,212, filed Jul. 15, 1991.

FIELD OF THE INVENTION

This invention relates to a heterojunction bipolar transistor and, more particularly, to the base structure incorporated in the heterojunction bipolar transistor.

DESCRIPTION OF THE RELATED ART

A bipolar transistor is inherently large in current driving capability than a field effect transistor, and research and development efforts are being made for the bipolar device with an emphasis put on a heterojunction bipolar transistor formed of III-V compound semiconductor layers. The heterojunction bipolar transistor is advantageous over a silicon bipolar transistor in emitter injection efficiency by virtue of the heterojunction between the base and the emitter. A typical example of the heterojunction bipolar transistor is illustrated in FIG. 1, and is fabricated on a semi-insulating substrate 1 of gallium arsenide. On the semi-insulating substrate 1 are stacked a collector layer 2 of n-type gallium arsenide which is partially removed for a collector electrode 3. A base layer 4 of p-type gallium arsenide is provided on a central area of the collector layer 2, and a base electrode 5 is formed on the peripheral areas of the base layer 2. The central area of the base layer 4 is overlain by an emitter layer 6 of n-type aluminum gallium arsenide ($Al_{0.25}Ga_{0.75}As$), and an emitter electrode 7 is formed on the emitter layer 7. The collector electrode 3, the base electrode 5 and the emitter electrode 7 are formed of gold-germanium-nickel alloy, gold-zinc-nickel alloy and gold-germanium-nickel alloy, respectively. In the prior art heterojunction bipolar transistor, the base structure is implemented by the base layer 4 only, and the base layer 4 is regulated to 70 to 100 nanometer for enhancing switching characteristics. The impurity concentration of the base layer 4 is of the order of $10^{19}$ $cm^{-3}$, and beryllium is usually doped into gallium arsenide in a molecular beam epitaxy. Though not shown in the drawings, a steep step configuration takes place in the edges of the energy band between the base layer 4 and the emitter layer 6. However, if the aluminum gallium arsenide for the emitter layer 6 is varied in the aluminum content, the energy band in the emitter layer 6 is graded toward the junction between the base layer 4 and the emitter layer 6.

The prior art heterojunction bipolar transistor shown in FIG. 1 is fabricated through a process sequence shown in FIGS. 2A to 2C. The prior art process starts with preparation of the semi-insulating substrate 1 of gallium arsenide An n-type gallium arsenide film 11, a p-type gallium arsenide film 12 and an n-type aluminum gallium arsenide film 13 ($Al_{0.25}Ga_{0.75}As$) are sequentially grown on the semi-insulating substrate 1 by using a molecular beam epitaxy. As p-type dopant, beryllium is usually introduced into gallium arsenide grown by using the molecular beam epitaxy. The resultant structure of this stage is shown in FIG. 2A.

On the n-type aluminum gallium arsenide film 13 is deposited a gold-germanium-nickel film which is overlain by a silicon dioxide film. The gold-germanium-nickel film and the silicon dioxide film are patterned through a lithographic process, and the emitter electrode 7 covered with a silicon dioxide film 14 are left on the aluminum gallium arsenide film 13. Using the composite mask structure of the emitter electrode 7 and the silicon dioxide film 14, the aluminum gallium arsenide film 13 is etched and patterned so that the emitter layer 6 is provided on the p-type gallium arsenide film 12. Gold-zinc-nickel film 18 is deposited on the entire surface of the structure, and the exposed p-type gallium arsenide film 12 and the silicon dioxide film 14 are covered with a gold-zinc-nickel film 15. Photoresist solution is spun onto the entire surface of the structure, and is patterned through a lithographic process so that a mask layer 16 is left on the gold-zinc-nickel film 15 as shown in FIG. 2B.

The mask layer 16 exposes a part of the gold-zinc-nickel film 15 to an etchant, and the gold-zinc-nickel film 15 is partially removed so that the base electrode 5 is formed on the p-type gallium arsenide film 12. Subsequently, the p-type gallium arsenide film 12 is partially etched away until the n-type gallium arsenide film 11 is exposed. The p-type gallium arsenide film 12 beneath the mask layer 16 serves as the base layer 4. The mask layer 16 is further available for the collector layer 2 as well as the collector electrode 3. The exposed surface portion of the n-type gallium arsenide film 11 is etched away, and gold-germanium-nickel alloy is deposited on the entire surface of the structure. The gold-germanium-nickel film 17 covers the mask layer 16 as well as the exposed n-type gallium arsenide film 11 which serves as the collector layer 2 as shown in FIG. 2C. When the mask layer 16 is removed by using an organic solvent, the gold-germanium-nickel film is left on the collector layer 2 only, and serves as the collector electrode 3.

In general, the cut-off frequency $f_T$ and the maximum oscillation frequency $f_{max}$ of a bipolar transistor are respectively given by Equations 1 and 2.

$$f_T = \{2\pi(\tau_E + \tau_B + \tau_C + \tau_{CC})\}^{-1} \qquad \text{Eq. 1}$$

$$f_{max} = (f_T / 8\pi r_b C_{BC}) \qquad \text{Eq. 2}$$

where $\tau_E$ is time constant at the emitter, $\tau_B$ is transit time across the base, $\tau_C$ is transit time across the collector, $\tau_{CC}$ is time constant at the collector, $r_b$ is resistance in the base, and $C_{BC}$ is capacitance between the base and the collector.

Equation 1 teaches that reduction of $\tau_B$ increases the cut-off frequency $f_T$, and a small amount of resistance $r_b$ effectively increases the maximum oscillation frequency $f_{max}$. However, there is a trade-off between the transit time $\tau_B$ and the resistance $r_b$ in view of the thickness of the base layer 4 of the prior art heterojunction bipolar transistor. Namely, if the base layer is decreased in thickness, the transit time $\tau_B$ become short, but the resistance $r_b$ is increased. In other words, when the cutoff frequency $f_T$ is improved by decreasing the transit time $\tau_B$, the maximum oscillation frequency $f_{max}$ is deteriorated by increasing the resistance $r_b$. Thus, it is impossible for the prior art heterojunction bipolar transistor to decrease the thickness of the base layer 4 less than 70 nanometer without sacrifice of the maximum oscillation frequency $f_{max}$.

The prior art process sequence also has a drawback in the patterning stage of the emitter layer 6. Namely, the emitter layer 6 is formed by etching the n-type gallium arsenide film 13 using the composite mask of the emitter electrode 7 and the silicon dioxide film 14. The etching should be finished at exposure of the p-type gallium arsenide film 12. If the finish is too early, the residual n-type gallium arsenide increases contact resistance between the base layer 4 and the base electrode 5 and, accordingly, the resistance $r_b$. This results in a low maximum oscillation frequency $f_{max}$. If, on the other hand, the etching proceeds to the p-type gallium arsenide film 12, an excessively thin base layer 4 increases the resistance $r_b$, and, accordingly, deteriorates the maximum oscillation frequency $f_{max}$. Moreover, the excessively thin base layer 4 allows the gold-zinc-nickel alloy to diffuse into the collector layer 2, and undesirable short-circuit takes place between the base layer 4 and the collector layer 2. Finally, the poor controllability of the etching stage results in irregularity of transistor characteristics. Since the base layer 4 is extremely thin, i.e., 70 nanometer to 100 nanometer, a slightly over-etched base layer 4 causes the transistor characteristics to widely fluctuate, and heterojunction bipolar transistors different in transistor characteristics are fabricated on a single wafer.

SUMMARY OF THE INVENTION

It is therefore an important object of the present invention to provide a heterojunction bipolar transistor which is improved in not only the cut-off frequency but also the maximum oscillation frequency.

It is also an important object of the present invention to provide a process of fabricating an heterojunction bipolar transistor which does not over-etches a base layer.

To accomplish these objects, the present invention proposes to provide a highly conductive current path in a base structure by using a carbon doped III-V compound semiconductor material.

In accordance with one aspect of the present invention, there is provided a heterojunction bipolar transistor fabricated on a semi-insulating substrate; comprising: a) an emitter structure having an emitter layer formed of an n-type first compound semiconductor material; b) a base structure held in contact with the emitter layer for forming an emitter-base heterojunction; and c) a collector layer formed of an n-type second compound semiconductor material and held in contact with the base structure for forming a base-collector junction, wherein the base structure has a first region formed of a p-type III-V compound semiconductor material, and a second region formed of carbon-doped gallium arsenide equal to or larger in hole density than the p-type III-V compound semiconductor material, the first and second regions providing a transit path to carriers supplied to the base structure, the p-type III-V compound semiconductor material containing at least one Group III element selected from the group consisting of gallium, aluminum and indium, and at least one Group V element selected from the group consisting of arsenic and phosphorus.

In accordance with another aspect of the present invention, there is provided a process of fabricating a heterojunction bipolar transistor comprising the steps of: a) preparing a semi-insulating substrate; b) growing a first n-type III-V compound semiconductor material, a beryllium doped III-V compound semiconductor material, a second n-type III-V compound semiconductor material, a third n-type III-V compound semiconductor material and a fourth n-type III-V compound semiconductor material by using a molecular beam epitaxy; c) forming an emitter electrode on the fourth n-type III-V compound semiconductor material with a first mask layer; d) patterning the fourth n-type III-V compound semiconductor material and the third n-type III-V compound semiconductor material through a first etching with the fist mask layer so as to form an emitter contact layer and a graded layer, a surface portion of the second n-type III-V compound semiconductor material being removed through the first etching with the first mask layer so that a shoulder portion takes place; e) covering the emitter contact layer, the graded layer and the shoulder portion with an insulating film; f) patterning the second n-type III-V compound semiconductor material and the beryllium doped III-V compound semiconductor material with the insulating film as a second mask layer so that the fist n-type III-V compound semiconductor material is exposed, the second n-type III-V compound semiconductor material and the beryllium doped III-V compound semiconductor material thus patterned serving as an emitter layer and a primary base layer, respectively; g) selectively growing a carbon doped III-V compound semiconductor material on the exposed surface of the first n-type III-V compound semiconductor material through a molecular beam epitaxy using an organic metal as a source of the Group III element, the carbon doped III-V compound semiconductor material being equal to or larger in hole concentration than the beryllium doped III-V compound semiconductor material; h) completing a base structure having a secondary base layer formed from the carbon doped III-V compound semiconductor material and a base electrode coupled to the secondary base layer; and i) completing a collector layer formed from the first n-type III-V compound semiconductor material and electrically connected to a collector layer.

In accordance with yet another aspect of the present invention, there is provided a process of fabricating a heterojunction bipolar transistor comprising the steps of: a) preparing a semi-insulating substrate; b) growing a first n-type III-V compound semiconductor material, a beryllium doped III-V compound semiconductor material, a second n-type III-V compound semiconductor material, a third n-type III-V compound semiconductor material and a fourth n-type III-V compound semiconductor material by using a molecular beam epitaxy; c) forming an emitter electrode on the fourth n-type III-V compound semiconductor material with a first mask layer; d) patterning the fourth n-type III-V compound semiconductor material and the third n-type III-V compound semiconductor material through a first etching with the fist mask layer so as to form an emitter contact layer and a graded layer, a surface portion of the second n-type III-V compound semiconductor material being removed through the first etching with the first mask layer so that a shoulder portion takes place; e) covering the emitter contact layer, the graded layer and the shoulder portion with an insulating film; f) patterning the second n-type III-V compound semiconductor material with the insulating film as a second mask layer so that the beryllium doped III-V compound semiconductor material is exposed, the second n-type III-V compound semiconductor material thus patterned serving as an emitter layer; g) selectively growing a carbon doped III-V compound semiconductor material on the exposed surface of the beryllium doped III-V compound semiconductor material through a molecular beam epitaxy using an organic metal as a source of the Group III element, the carbon doped III-V compound semiconductor material being equal to or larger in hole concentration than the beryllium doped III-V compound semiconductor material; h) completing a base structure having a base contact layer formed from the carbon doped III-V compound semiconductor material, a base layer formed from the carbon doped III-V compound semiconductor material and a base electrode coupled to the base contact layer; and i) completing a collector layer formed from the first n-type III-V compound semiconductor material and electrically connected to a collector layer.

BRIEF DESCRIPTION OF THE DRAWINGS

The features and advantages of the heterojunction bipolar transistor and the process of fabrication thereof according to the present invention will be more clearly understood from the following description taken in conjunction with the accompanying drawings in which.

APPROACH TO SOLUTION OF PROBLEMS

Figure 1:
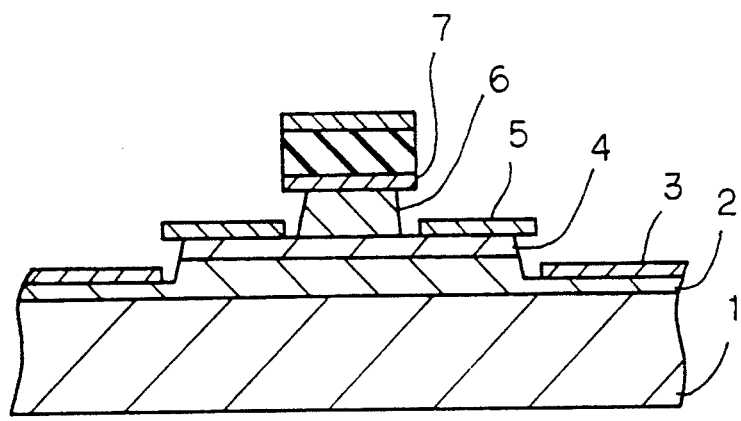
FIG. 1 is a cross sectional view showing the structure of the prior art heterojunction bipolar transistor.
Figure 2A:
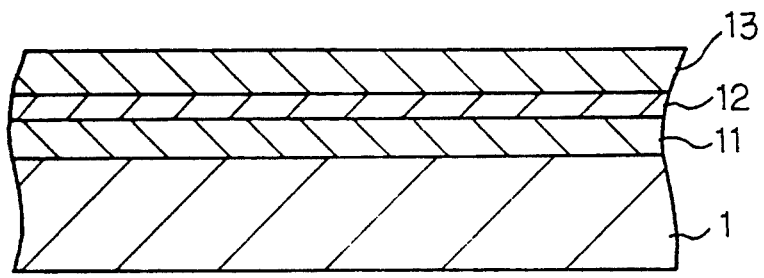
FIGS. 2A to 2C are cross sectional views showing the process sequence of fabricating the prior art heterojunction bipolar transistor shown in FIG. 1.
Figure 2B:
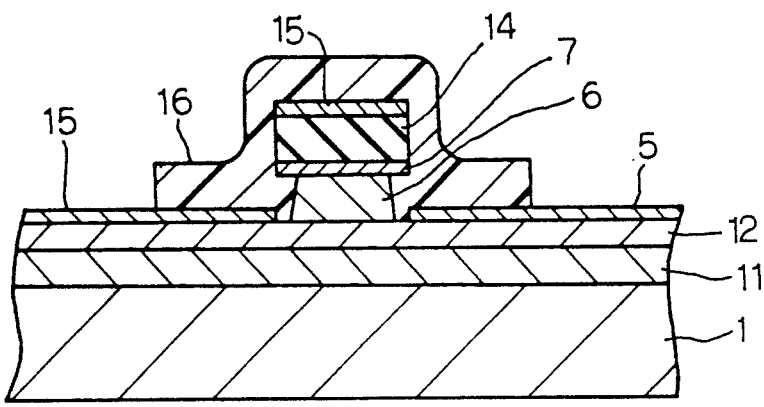
Figure 2C:
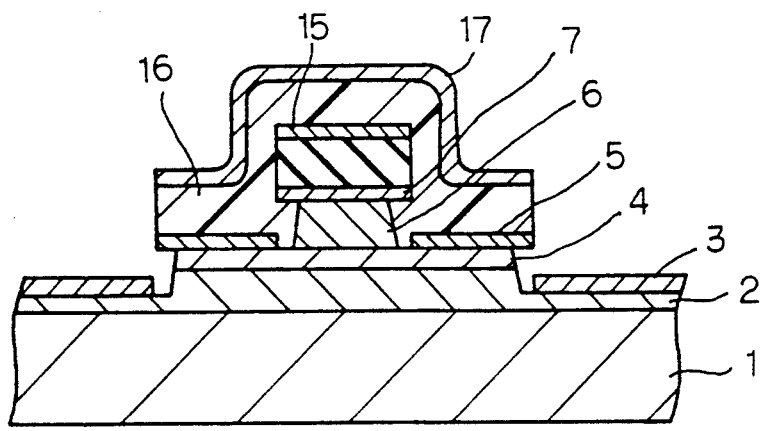

The base resistance $r_b$ is expressed by Equation 3.

$$r_b = \{(Rs\ W_E/12L) + Rs\ L_{ED}/2L + (Rs\rho c)^{\frac{1}{2}}/2L\ coth(L_B L_T)\} \qquad \text{Eq.}$$

where Rs is sheet resistance of the base layer, $W_E$ is the width of the emitter layer, L is the length of the emitter, $L_{EB}$ is distance between the mesa-shaped emitter layer and the base electrode, $\rho c$ is contact resistivity coupled to the base electrode, $L_B$ is the width of the base layer, and $L_T$ is equal to $(\rho c/Rs)^{\frac{1}{2}}$.

Equation 3 teaches that a low base resistance $r_b$ is achieved by reduction of Rs and/or $\rho c$. In an actual transistor, the base resistance $r_b$ is much affected by the third term of the right side, and reduction of $\tau c$ is more important than reduction of Rs. If the p-type gallium arsenide is increased in impurity concentration, $\rho c$ is effectively decreased. However, the p-type impurities, i.e., beryllium atoms, are hardly increased over $5 \times 10^{19}$ cm$^{-3}$, because excess beryllium atoms tend to diffuse into the n-type aluminum gallium arsenide in sequential epitaxial growth using a molecular beam epitaxy. This undesirable phenomenon was reported by Y. C. Pao et. al. in Journal of Applied Physics, 1986, vol. 60, page 201.

The inventor finds that carbon doped p-type compound semiconductor material and various ohmic metals form a contact with a low contact resistivity, and heavily doped carbon doped gallium arsenide is easily grown by using a molecular beam epitaxy using an organic metal as a source of the Group III element as reported by T. Yamada et. al, Journal of Crystal Growth, 1989, vol. 95, page 145. According to the report by Yamada et. al., the carbon concentration is enhanced to about $10^{21}$ cm$^{-3}$, and the molecular beam epitaxy using an organic metal source selectively grows a compound semiconductor material. The inventor forms various contacts, and the contact resistivity is measured as shown in Table 1.

TABLE 1

| Compound | Hole Density (cm$^{-3}$) | Contact Resistivity (ohm − cm$^2$) | |
| --- | --- | --- | --- |
| | | Ti/Pt/Au | Au/Mn |
| Be-doped GaAs | $4 \times 10^{19}$ | $4.4 \times 10^{-6}$ | $1.5 \times 1.0^{-6}$ |
| C-doped GaAs | $1 \times 10^{20}$ | $2.4 \times 10^{-7}$ | $1.8 \times 10^{-7}$ |
| C-doped GaAs | $4 \times 10^{20}$ | $5.4 \times 10^{-8}$ | $5.1 \times 10^{-8}$ |

In order to measure the contact resistivity, the beryllium doped gallium arsenide is grown by using the usual molecular beam epitaxy, and the molecular beam epitaxy with the organic metal source for the Group III element is used for the carbon-doped gallium arsenide materials. The contact resistivity is measured before alloying.

The carbon-doped p-type gallium arsenide is affinity to a beryllium doped p-type III-V compound semiconductor material because of low contact resistivity therebetween. The inventor forms a contact between beryllium doped gallium arsenide and carbon doped gallium arsenide, and evaluates as described hereinbelow. First, beryllium doped gallium arsenide is grown by using the molecular beam epitaxy followed by a selective growth of carbon-doped gallium arsenide through the molecular beam epitaxy using the organic metal source. Contact resistivity is measured as shown in Table 2.

TABLE 2

| Hole Density (cm$^{-3}$) | | Contact Resistivity (ohm − cm$^2$) |
| --- | --- | --- |
| Be-doped GaAs | C-doped GaAs | |
| $4 \times 10^{19}$ | $1 \times 10^{20}$ | $1.1 \times 10^{-7}$ |
| $4 \times 10^{19}$ | $4 \times 10^{20}$ | $7.1 \times 10^{-8}$ |

As will be understood from Table 2, the contact resistivity between the beryllium doped gallium arsenide and the carbon doped gallium arsenide is low enough to form a base structure with low resistance.

Figure 3:
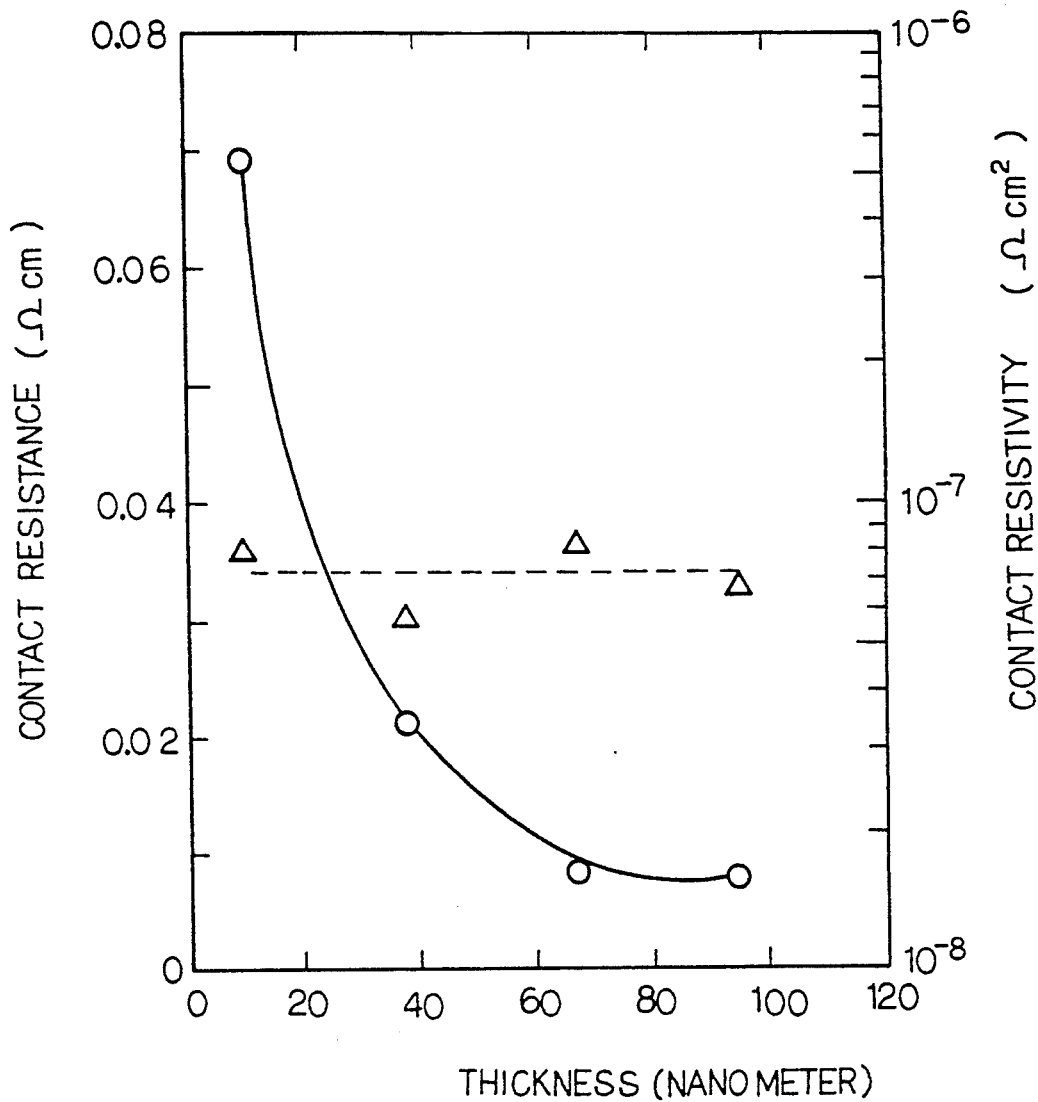
FIG. 3 is a graph showing contact resistance and contact resistivity in terms of the thickness of a beryllium doped gallium arsenide film.

As described hereinbefore, the concentration of beryllium can not exceed $5 \times 10^{19}$ cm$^{-3}$, however, carbon doped gallium arsenide easily achieves the hole density more than ten times larger than that of the beryllium doped gallium arsenide. For this reason, a low resistive base structure can be implemented by the combination of a beryllium doped III-V compound semiconductor film and a carbon doped III-V compound semiconductor film. In fact, in a case where the beryllium doped gallium arsenide with hole density of $4\times10^{19}$ cm$^{-3}$ is held in contact with the carbon doped gallium arsenide with hole density of $4\times10^{20}$ cm$^{-3}$, the contact resistivity is substantially uniform as indicated by small triangles in FIG. 3, however, the contact resistance indicated by small bubbles is drastically decreased by increasing the thickness of the beryllium doped gallium arsenide film. For the experiment, beryllium doped gallium arsenide films are laminated, and are partially etched away. A carbon doped gallium arsenide film is selectively grown to a thickness of about 200 nanometer in such a manner that the carbon doped gallium arsenide is brought into contact with the exposed edges of the beryllium doped gallium arsenide films at right angle. The evaluation is carried out by using TLM method which is reported by G. K. Reeves et. al., IEEE Electron Device Letters, EDL vol. 3, 1982, page 111. The relation between the contact resistivity $\rho ci$ and the contact resistance Rci is represented by Equation 4

$$\rho ci = Rci \times W \qquad \text{Eq. 4}$$

where W is the thickness of the beryllium doped gallium arsenide film.

The combination of a beryllium doped III-V compound semiconductor substance and a carbon doped III-V compound semiconductor substance forms various base structures. For example, the first base structure is implemented by a primary base layer provided between an emitter layer and a collector layer and a secondary base layer provided between the collector layer and a base layer. Another base structure has a base layer provided between an emitter layer and a collector layer and a base contact layer provided between the base layer and a base electrode. Both base structures surely decrease the base resistance, and improve the maximum oscillation frequency without sacrifice of the cut-off frequency. The maximum beryllium concentration of the III-V compound semiconductor material is about $5\times10^{19}$ cm$^{-3}$, and the maximum carbon concentration of the III-V compound semiconductor material is about $10^{21}$ cm$^{-3}$.

Figure 4:
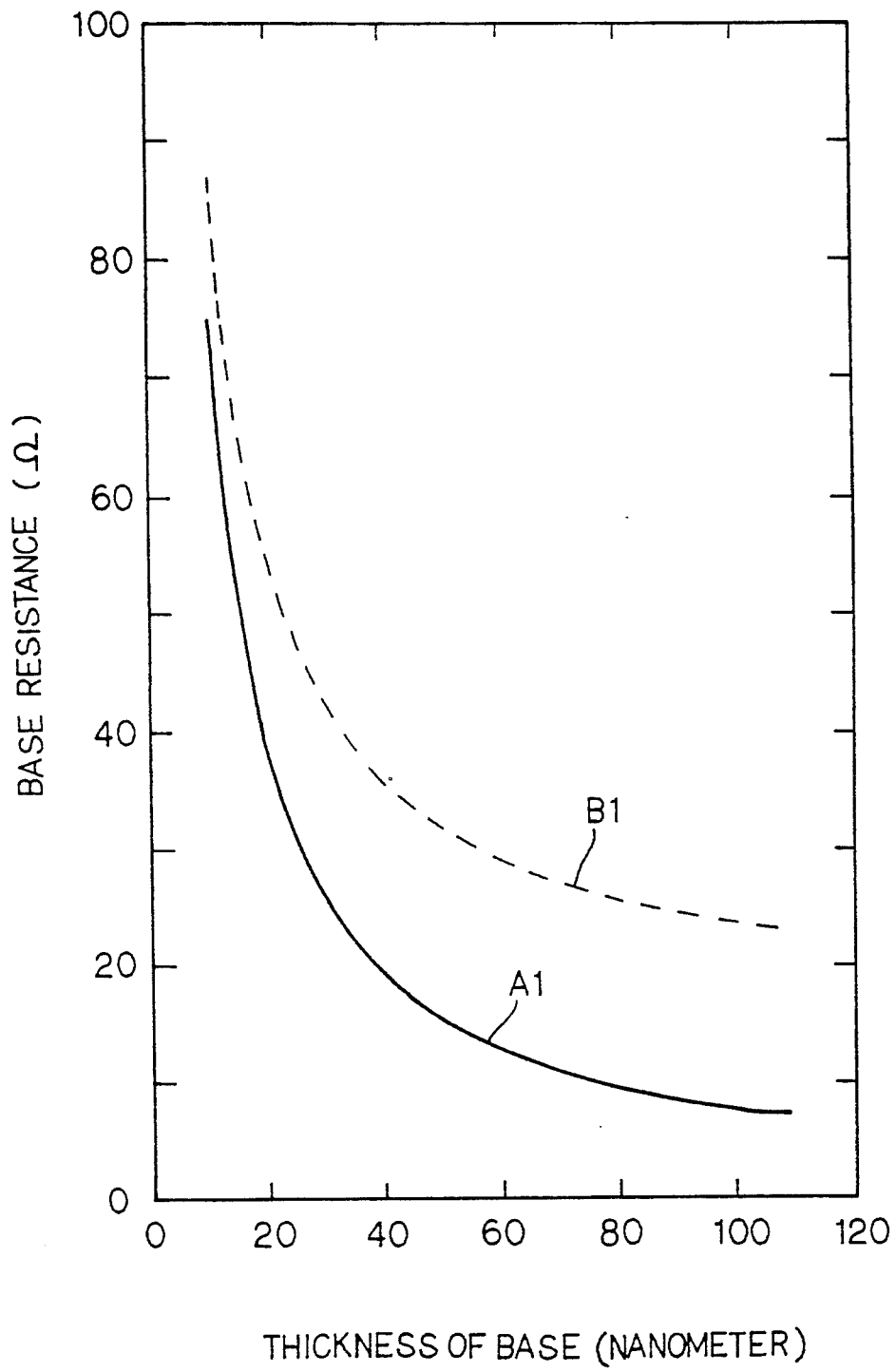
FIG. 4 is a graph showing base contact in terms of the thickness of base for a combined base structure of primary and secondary base layers as well as a prior art base layer.

FIG. 4 shows base resistance in terms of the thickness of base. The emitter layer is held in contact with the base structure at the emitter-base contact area of 1 micron by 10 microns, the width of the base electrode is 1.5 microns, the distance between the mesa-shaped emitter and the base electrode is about 0.2 micron, and the base electrode is formed of titanium- platinum- gold without alloying. The base structure according to the present invention is implemented by the primary base with hole density of $4\times10^{19}$ cm$^{-3}$ and the secondary base with hole density of $4\times10^{20}$ cm$^{-3}$ provided outside the primary base. The secondary base is about 300 nanometer in thickness, and the prior art base layer has hole density of about $4\times10^{19}$ cm$^{-3}$. The contact surface between the primary and secondary bases is substantially perpendicular to the emitter-and-base contact area. If the thickness of the base structure is decreased, the base resistance traces plots A1. Plots B1 stands for the beryllium doped gallium arsenide base layer incorporated in the prior art heterojunction bipolar transistor. The prior art base layer also decreases the base resistance by increasing the thickness, however, the base structure according to the present invention is surely lower in resistance than the prior art base layer in so far as the thicknesses are equal to each other. Thus, the high hole-density secondary base combined with the primary base is effective for reduction of the base resistance.

Figure 5:
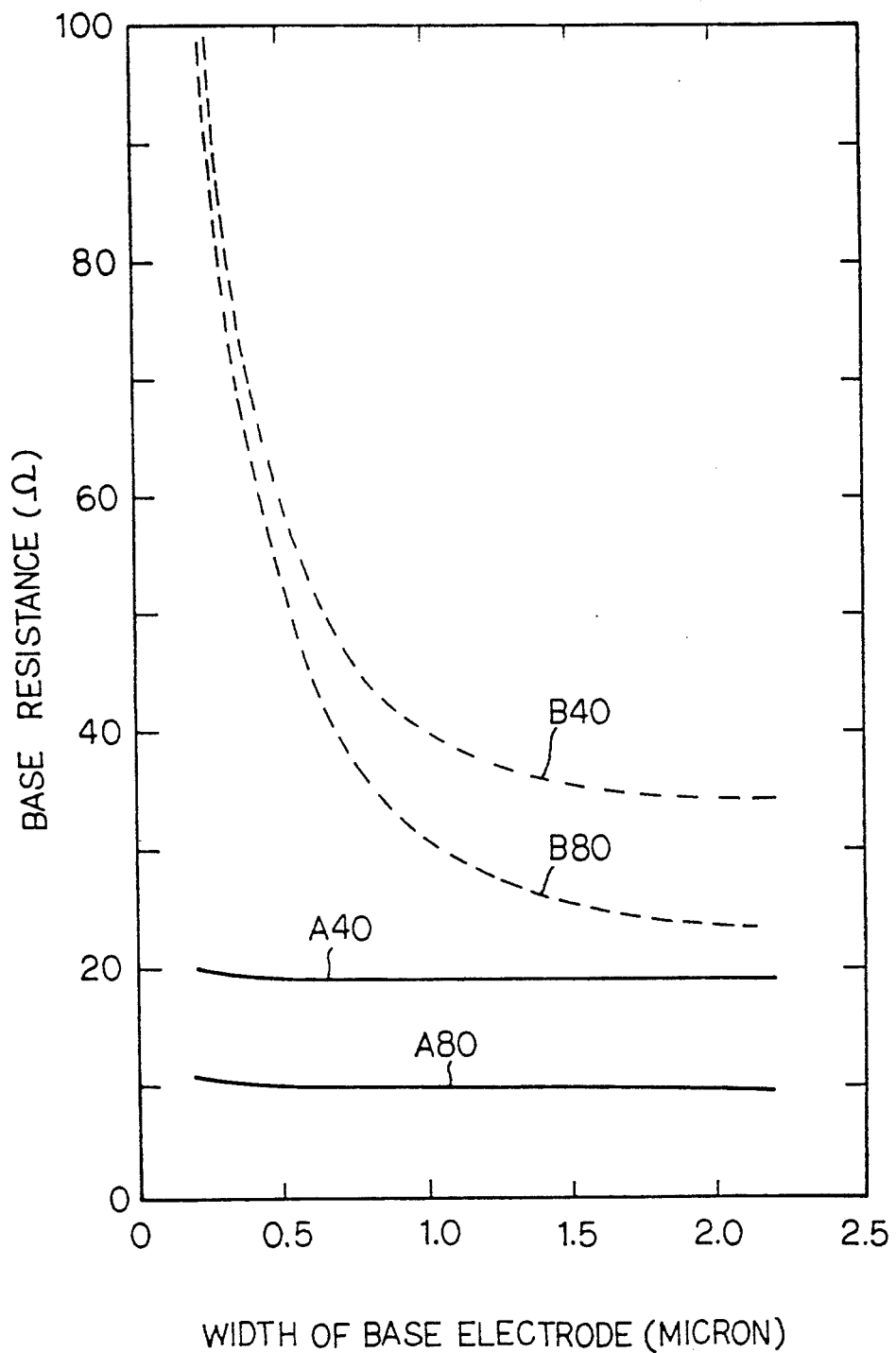
FIG. 5 is a graph showing base resistance in terms of the width of base electrode for the combined base structures as well as the prior art base layers.

The combination of the primary and secondary base layers are desirable for miniaturization of transistor. FIG. 5 shows the base resistance in terms of the width of base electrode. Plots A40 and A80 stand for the combined base structures having the thicknesses of 40 nanometer and 80 nanometer, respectively. The prior art base layer of 40 nanometer and the prior art base layer of 80 nanometer respectively trace plots B40 and B80 when the base electrode widths are decreased. Comparing plots A40 and A80 with plots B40 and B80, the prior art base layers drastically increase the resistance when the widths are decreased under 1.5 microns, however, the base structures according to the present invention is substantially constant in the base resistance. This means that the combined base structure is desirable for enhancement of the transistor characteristics through the down-scaling.

Figure 6:
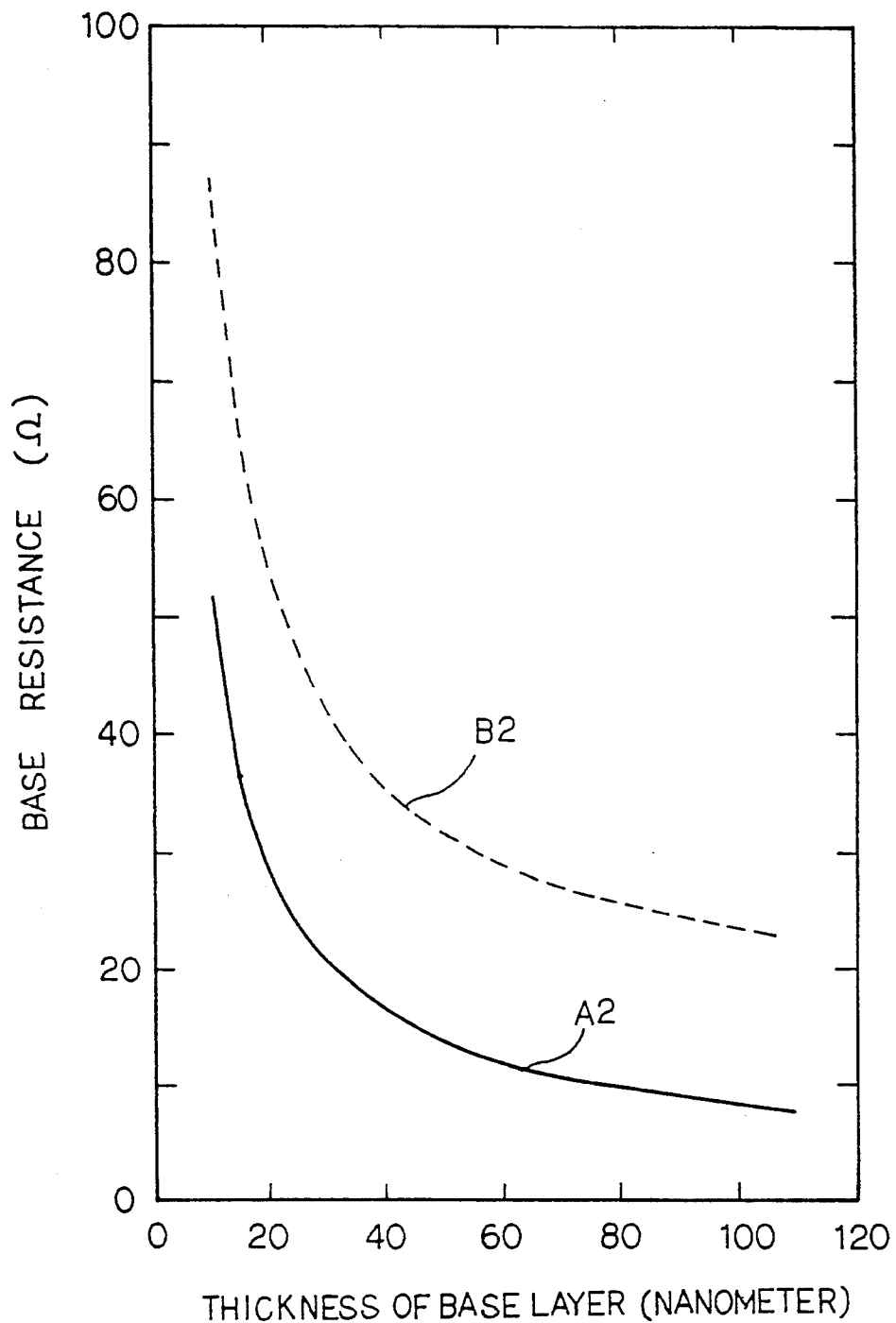
FIG. 6 is a graph showing base resistance in terms of the thickness of base layer for a base structure according to the presence invention as well as a prior art base layer.

Another base structure according to the present invention is implemented by a base layer of a p-type III-V compound semiconductor material and a base contact layer of carbon-doped gallium arsenide, and only the base layer is held in contact with the emitter-base heterojunction and the base-collector junction. The base layer is contacted with the base contact layer of carbon-doped gallium arsenide provided between a base electrode and the base layer. The base resistance in terms of the thickness of the base layer is evaluated as similar to the combined structure. FIG. 6 shows the base resistance in terms of the thickness of the base layer. The emitter layer is held in contact with the base layer at the emitter-base contact area of 1 micron by 10 microns, the width of the base electrode is 1.5 microns, the distance between the mesa-shaped emitter and the base electrode is about 0.2 micron, and the base electrode is formed of titanium-platinum-gold without alloying The base structure according to the present invention is implemented by the base layer with density of $4\times10^{19}$ cm$^{-3}$ and the base contact layer with hole density of $4\times10^{20}$ cm$^{-3}$. The base contact layer is about 300 nanometer in thickness, and the prior art base layer has hole density of about $4\times10^{19}$ cm$^{-3}$. If the thickness of the base layer associated with the base contact layer is decreased, the base resistance traces plots A2. Plots B2 stands for the beryllium doped gallium arsenide base layer incorporated in the prior art heterojunction bipolar transistor. The prior art base layer also decreases the base resistance by increasing the thickness, however, the base structure according to the present invention is surely lower in resistance than the prior art base layer in so far as the thicknesses are equal to each other. Thus, the high hole-density base contact layer is effective for reduction of the base resistance.

Figure 7:
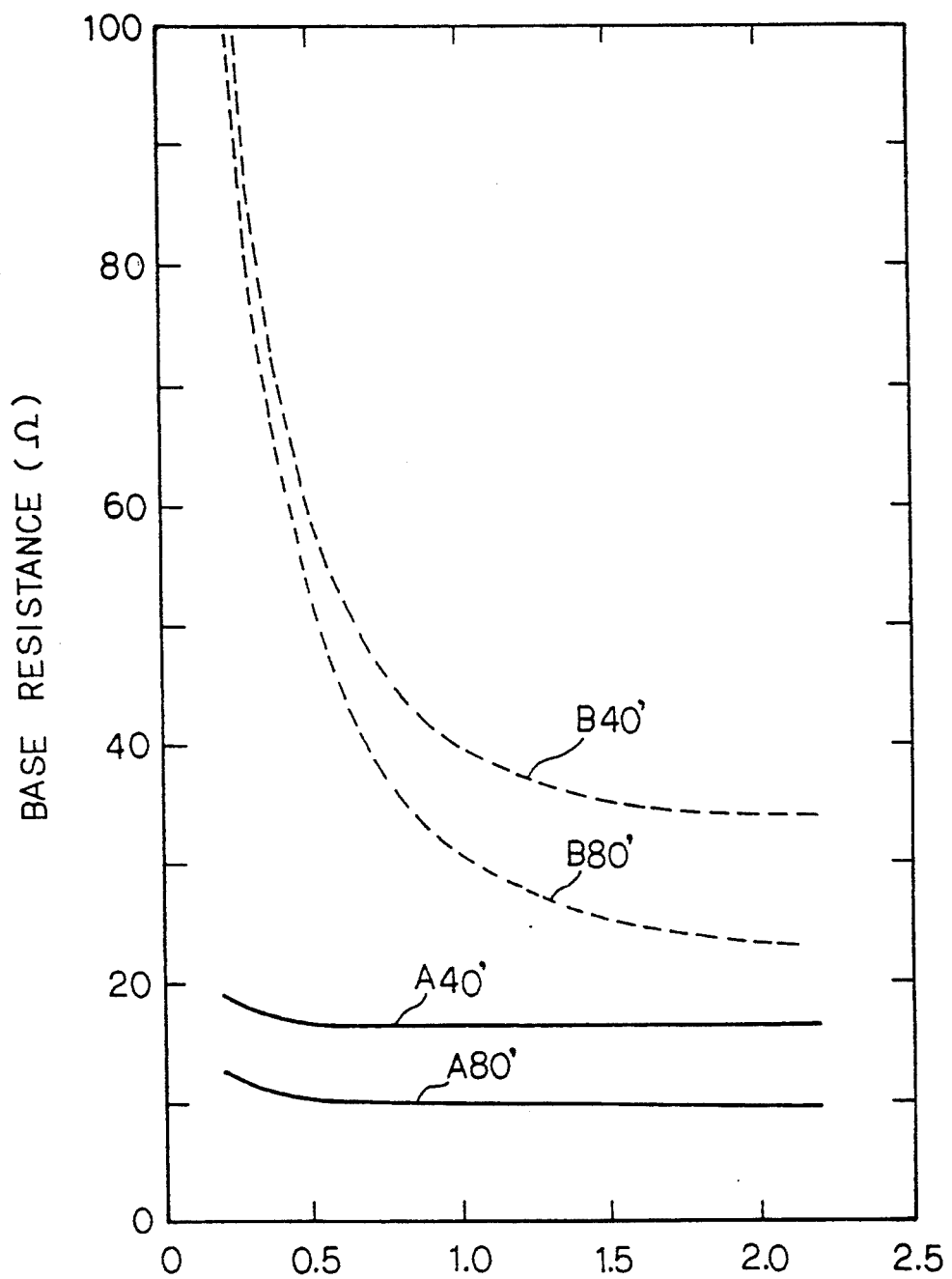
FIG. 7 is a graph showing base resistance in terms of the width of base electrode for the base structures of the present invention as well as the prior art base layers.

FIG. 7 shows the base resistance in terms of the width of base electrode. Plots A40' and A80' stand for the combined base structures having the thicknesses of 40 nanometer and 80 nanometer, respectively. The prior art base layer of 40 nanometer and the prior art base layer of 80 nanometer respectively trace plots B40' and B80' when the base electrode widths are decreased. Comparing plots A40' and A80' with plots B40' and B80', the prior art base layers drastically increase the resistance when the widths are decreased under 1.5 microns, however, the base structures according to the present invention are substantially constant in the base resistance. This means that the combined base structure is desirable for enhancement of the transistor characteristics through the down-scaling. Moreover, the reduction in base resistance allows the thickness of the base layer to be decreased, and, accordingly, the heterojunction bipolar transistor according to the present invention is improved in the cut-off frequency without sacrifice of the maximum oscillation frequency. Additionally, if the base contact layer is thick enough to diffuse the substance used for the base electrode into the collector layer, the collector layer is protected from contamination. A thick base contact layer improves the step coverage at the mesa-shaped configuration, and, for this reason, upper wiring strips are prevented from undesirable disconnection.

DESCRIPTION OF THE PREFERRED EMBODIMENTS

First Embodiment

Figure 8:
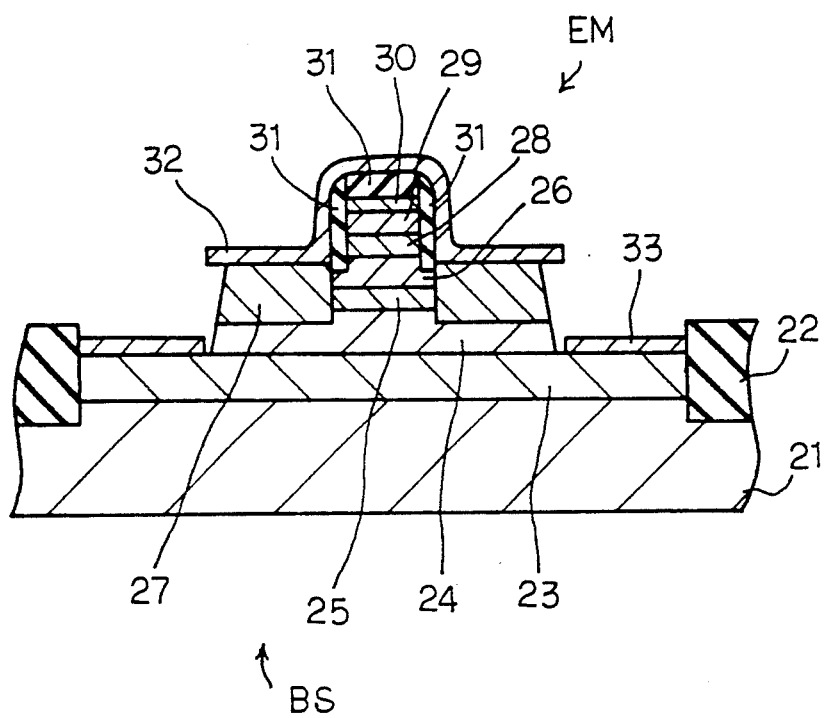
FIG. 8 is a cross sectional view showing the structure of a heterojunction bipolar transistor according to the present invention.

Referring to FIG. 8 of the drawings, a heterojunction bipolar transistor embodying the present invention is fabricated on a semi-insulating substrate 21 of gallium arsenide, and an insulating layer 22 isolates a device area for the heterojunction bipolar transistor. On the semi-insulating substrate 21 is formed a collector contact layer 3 of n-type gallium arsenide which is partially overlain by a collector layer 24 of n-type gallium arsenide and in part exposed. On a central zone of the collector layer 24 is stacked a primary base layer 25 of p-type gallium arsenide which in turn is overlain by an emitter layer 26 of n-type aluminum gallium arsenide represented by the molecular formula of $Al_{0.25}Ga_{0.75}As$. On the peripheral zone of the collector layer 24, a secondary base layer 27 is formed of p-type gallium arsenide, and the emitter layer 6 is held in contact with the secondary base layer 27. However, only the primary base layer 25 providas a transit path for carriers between the emitter layer 26 and the collector layer 24. On the emitter layer 26 is formed a graded layer 28 of n-type aluminum gallium arsenide represented by the molecular formula of $Al_xGa_{1-x}As$ where x is varied from 0.25 to 0, and an emitter contact layer 29 is formed on the graded layer 28. In this instance, the emitter layer 26, the graded layer 28 and the emitter contact layer 29 as a whole constitute an emitter structure EM, and the primary and secondary base layers 25 and 27 form in combination a base structure BS. An emitter electrode 30 of gold-germanium-nickel is in contact with the emitter contact layer 29, and most of the side surface and the top surface of the emitter structure EM is covered with a silicon dioxide film 31. The silicon dioxide 31 isolates a base electrode 32 of titanium-platinum-gold from the emitter structure EM, and is held in contact with the secondary base layer 27. The peripheral zone of the collector contact layer 23 is covered with a collector electrode 33 of gold-germanium-nickel.

Figure 9A:
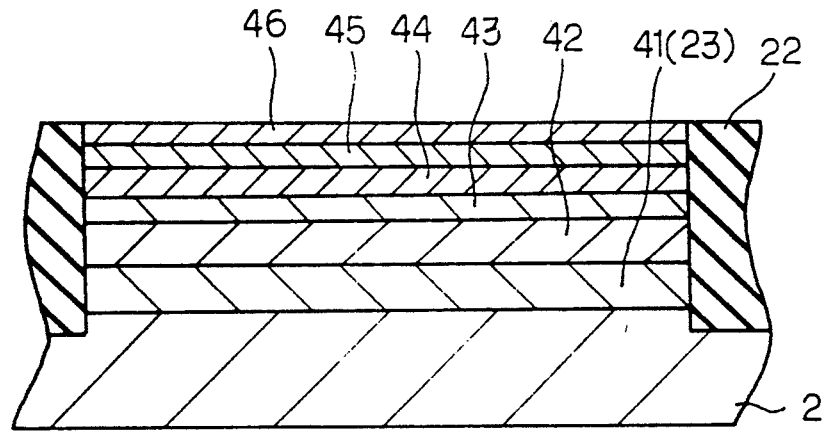
FIGS. 9A to 9E are cross sectional views showing a process sequence for fabricating the heterojunction bipolar transistor shown in FIG. 8.

The heterojunction bipolar transistor implementing the first embodiment is fabricated from a process sequence described hereinbelow with reference to FIGS. 9A to 9E. The process starts with preparation of the semi-insulating substrate 21. On the semi-insulating substrate 21 are successively grown an n-type gallium arsenide film 41 doped with n-type impurity atoms of about $3 \times 10^{18}$ cm$^{-3}$, an n-type gallium arsenide film 42 doped with n-type impurity atoms of about $5 \times 10^{16}$ cm$^{-3}$, a p-type gallium arsenide film 43 doped with beryllium atoms of about $3 \times 10^{19}$ cm$^{-3}$, an n-type aluminum gallium arsenide film ($Al_{0.25}Ga_{0.75}As$) 44 doped with n-type impurity atoms of about $3 \times 10^{17}$ cm$^{-3}$, a graded n-type aluminum gallium arsenide film ($Al_xGa_{1-x}As$ where x varies from 0.25 to zero from the n-type aluminum gallium arsenide film 44) 45 doped with n-type impurity atoms of about $3 \times 10^{17}$ cm$^{-3}$ and an n-type gallium arsenide film 46 doped with n-type impurity atoms of about $3 \times 10^{18}$ cm$^{-3}$ through a molecular beam epitaxy at about 600 degrees in centigrade, and the n-type gallium arsenide film 41, the n-type gallium arsenide film 42, the p-type gallium arsenide film 43, the n-type aluminum gallium arsenide film 44, the graded n-type aluminum gallium arsenide film 45 and the n-type gallium arsenide film 46 are respectively grown to the thicknesses of 400 nanometer, 400 nanometer, 40 nanometer, 200 nanometer, 50 nanometer and 50 nanometer. After the epitaxial growth, boron ion (B+) is selectively implanted into the semi-insulating substrate 21 and the epitaxially grown layers 41 to 46 so as to produce the insulating layer 22. The n-type gallium arsenide layer 41 provides the collector contact layer 23, and the resultant structure of this stage is shown in FIG. 9A.

Figure 9B:
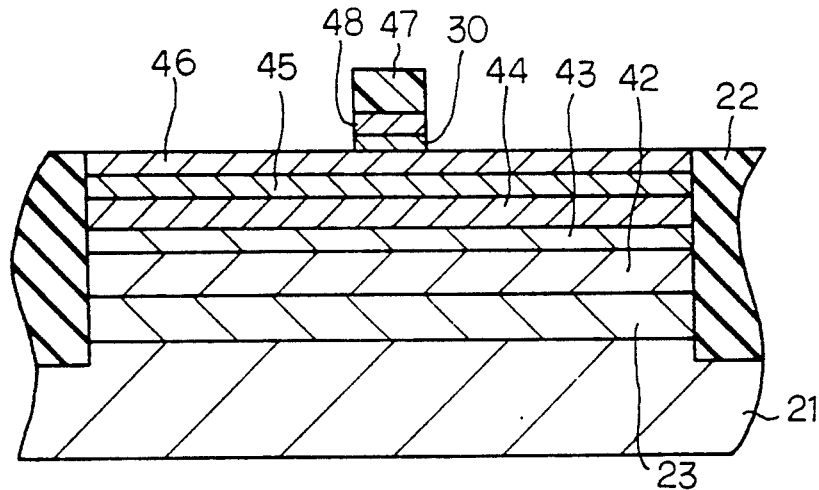

Gold-germanium-nickel is deposited on the entire surface of the structure through an evaporation technique, and a thin silicon dioxide film is deposited on the gold-germanium-nickel film. A photoresist solution is spun onto the silicon dioxide film, and the photoresist film is patterned through a lithographic process. Then, a photoresist mask 47 is left on thin silicon dioxide film, and the silicon dioxide film is, then, etched by using a reactive ion beam etching technique. A silicon dioxide mask 48 is patterned beneath the photoresist mask 47. Subsequently, the gold-germanium-nickel film is selectively etched away by through an ion milling, and the emitter electrode 30 is left beneath the silicon dioxide mask 47 as shown in FIG. 9B.

Figure 9C:
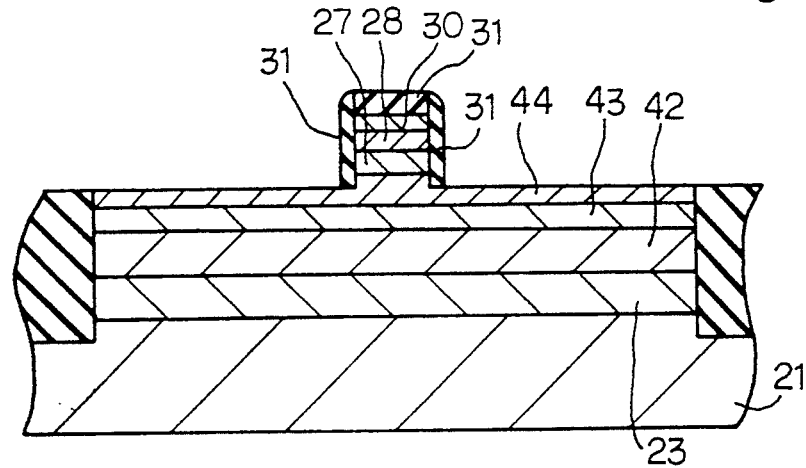

The photoresist mask 47 is removed by using an organic solvent, and the n-type gallium arsenide film 46 and the graded n-type aluminum gallium arsenide film 45 are etched and patterned through a reactive ion etching technique using an etchant containing chlorine ($Cl_2$). The reactive ion etching is continued until the aluminum gallium arsenide film 44 exposed to the etchant is etched to a predetermined thickness. The continuous etching produces a shoulder portion, and the predetermined thickness is of the order of tens nanometer. The n-type gallium arsenide film 46 and the graded n-type aluminum gallium arsenide film 45 thus patterned provide the emitter contact layer 29 and the graded layer 28, respectively. Silicon dioxide is deposited over the entire surface of the structure, and a reactive ion etching technique using an etchant containing tetrafluoride is applied to the silico dioxide film. The silicon dioxide film 31 is left on the shoulder portion of the aluminum gallium arsenide film 44, and covers the emitter contact layer 29 and the graded layer 28. It is desirable for the aluminum gallium arsenide film 44 beneath the silicon dioxide film 31 to be completely depleted, and the predetermined thickness of tens nanometer allows the aluminum gallium arsenide film 44 to be completely depleted. The advantages of the complete depletion are described by Hayama et al, Technical Report of Electron Information Communication Society, 1987, ED89-147, page 67. The thin aluminum gallium arsenide film 44 beneath the silicon dioxide film 31 is prevented from local increase of resistance. The resultant structure of this stage is shown in FIG. 9C.

Figure 9D:
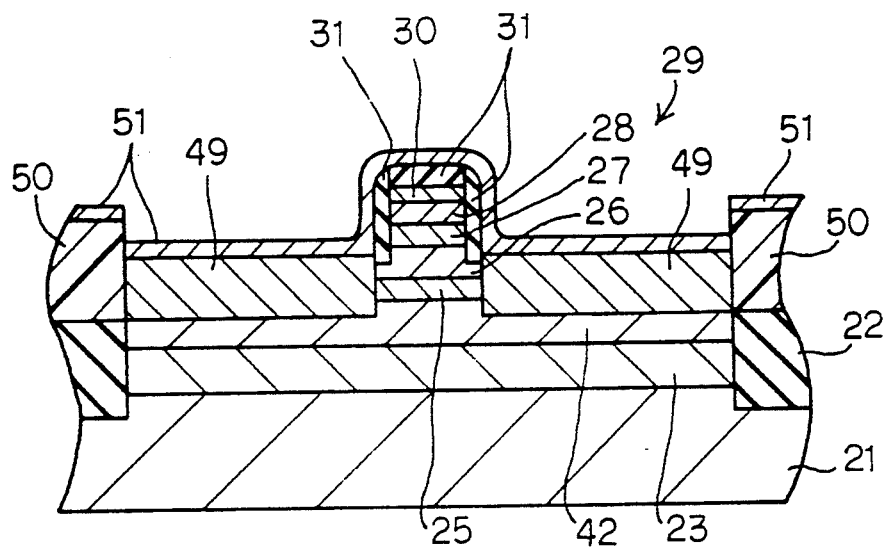

Using the silicon dioxide film 31 as a mask, the n-type aluminum gallium arsenide film 44 and the p-type gallium arsenide film 43 are etched and patterned in a water solution of phosphoric acid and hydrogen peroxide, and the n-type gallium arsenide film 42 is decreased in thickness. The n-type aluminum gallium arsenide 44 and the p-type gallium arsenide 43 are thus successively patterned in the single wet etching stage, and no problem is enountered in residual n-type aluminum gallium arsenide as well as in over-etching of p-type gallium arsenide. Using the silicon dioxide film 31 as a mask, a p-type gallium arsenide film 49 is selectively grown on the n-type galium arsenide film 42 through a molucular beam epitaxy using trimethylgallium ($Ga(CH_3)_3$) and solid arsenic as sources. The p-type gallium arsenide film 49 is doped with carbon, and is grown to about 300 nanometer at about 450 degrees in centigrade. The carbon concentration is as large as $4 \times 10^{20}$ cm$^{-3}$. A photomask is formed so as to cover the device area, and the p-type gallium arsenide film 49 on the insulating layer 22 is etched away. A new photomask 50 is formed and covers the insulating layer 50. A titanium-plutinum-gold film 51 is deposited over the entire surface of the structure as shown in FIG. 9D.

Figure 9E:
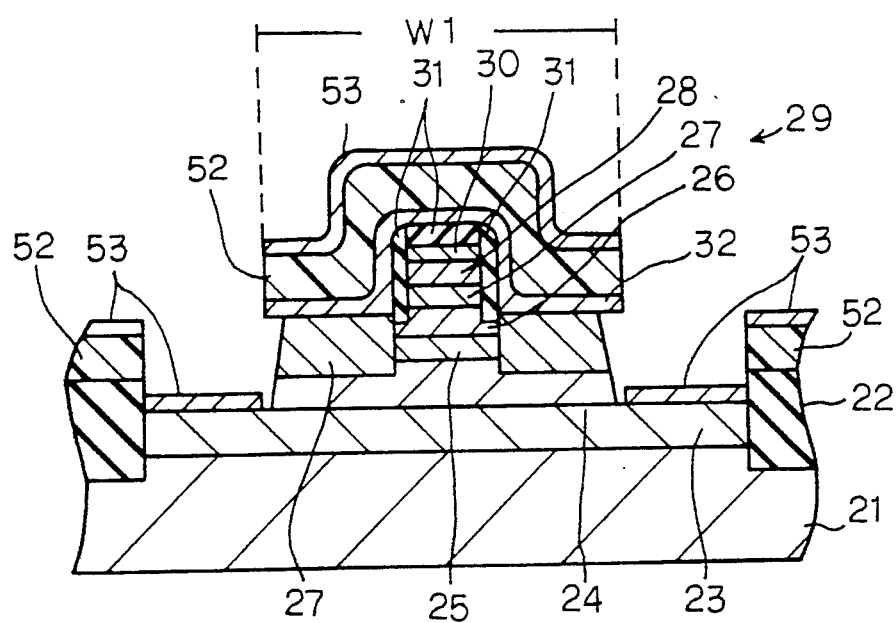

After the deposition of the titanium-plutinum-gold film 51, the photomask 50 is stripped off in an organic solvent, and a new photomask 52 is formed on the titanium-plutinum-gold film 51. The photomask 52 defines a width W1 of the base electrode 32. Using the photomask 52, the titanium-plutinum-gold film is subjected to an ion milling, and the base electrode 32 is left beneath the photomask 52. Subsequently, the p-type gallium arsenide film 49 and the n-type gallium arsenide film 42 are exposed to the water solution of phosphoric acid and hydrogen peroxide, and the secondary base layer 27 and the collector layer 24 are left beneath the base electrode 32. A gold-germanium-nickel film 53 is deposited by using the evaporation technique as shown in FIG. 9E, and the photomask 52 is, then, exposed to the organic solvent. The photomask 52 is stripped off, and the collector electrode 53 is left on the collector contact layer 23.

The heterojunction bipolar transistor implementing the first embodiment is fabricated also through a process sequence described hereinbelow with reference to FIGS. 9A to 9E. The process starts with preparation of the semi-insulating substrate 21. On the semi-insulating substrate 21 are successively grown an n-type gallium arsenide film 41 doped with n-type impurity atoms of about $3 \times 10^{18}$ cm$^{-3}$, an n-type gallium arsenide film 42 doped with n-type impurity atoms of about $5 \times 10^{16}$ cm$^{-3}$, a p-type gallium arsenide film 43 doped with carbon atoms of about $6 \times 10^{19}$ cm$^{-3}$, an n-type aluminum gallium arsenide film ($Al_{0.25}Ga_{0.75}As$) 44 doped with n-type impurity atoms of about $3 \times 10^{17}$ cm$^{-3}$, a graded n-type aluminum gallium arsenide film ($Al_x Ga_{1-x}As$ where x varies from 0.25 to zero from the n-type aluminum gallium arsenide film 44) 45 doped with n-type impurity atoms of about $3 \times 10^{17}$ cm$^{-3}$ and an n-type gallium arsenide film 46 doped with n-type impurity atoms of about $3 \times 10^{18}$ cm$^{-3}$ through metalorganic chemical vapor deposition at about 650 degrees in centigrade except for the p-type gallium arsenide film 43. The p-type gallium arsenide film 43 is grown at about 500 degrees in centigrade. The n-type gallium arsenide film 41, the n-type gallium arsenide film 42, the p-type gallium arsenide film 43, the n-type aluminum gallium arsenide film 44, the graded n-type aluminum gallium arsenide film 45 and the n-type gallium arsenide film 46 are respectively grown to the thicknesses of 400 nanometer, 400 nanometer, 40 nanometer, 200 nanometer, 50 nanometer and 50 nanometer. The other steps forming parts of the process sequence are almost the same as the above-mentioned process sequence for the first embodiment.

The first embodiment forms the heterojunction between the aluminum gallium arsenide film 44 and the p-type gallium arsenide films 43 adn 49. However, various III-V compound semiconductor materials are available for the heterojunction. For example, a primary base layer may be formed of berillium or carbon doped aluminum gallium arsenide, and the beryllium or carbon doped aluminum gallium arsenide may be of a graded base. The present invention further appertains to heterojunction bipolar transistors in the AlInAs/InGaAs system as well as in InP/InGaAs system. In such implementations, the primary base layers are formed of p-type indium gallium arsenide. P-type aluminum indium gallium arsenide and p-type indium gallium arsenic phosphide are also available for the primary base layer.

As will be understood from the foregoing description, the carbon doped secondary base layer decreases the base resistance of a heterojunction bipolar transistor, and, accordingly, allows the primary and secondary base layers to be decreased in thickness. This results in improvement in not only the maximum oscillation frequency but also the cut-off frequency.

Moreover, the fabrication process according to the present invention is advantageous over the prior art process sequence in that the emitter layer 26 and the primary base layer 25 are successively patterned in the single wet etching stage, and, for this reason, any problem never takes place in the base contact resistance due to residual n-type aluminum gallium arsenide or an over-etched base layer. The process sequence according to the present invention is further advantageous in reproducibility of the structure, and, accordingly, the transistor characteristics are easily fallen into predetermined range.

Second Embodiment

Figure 10:
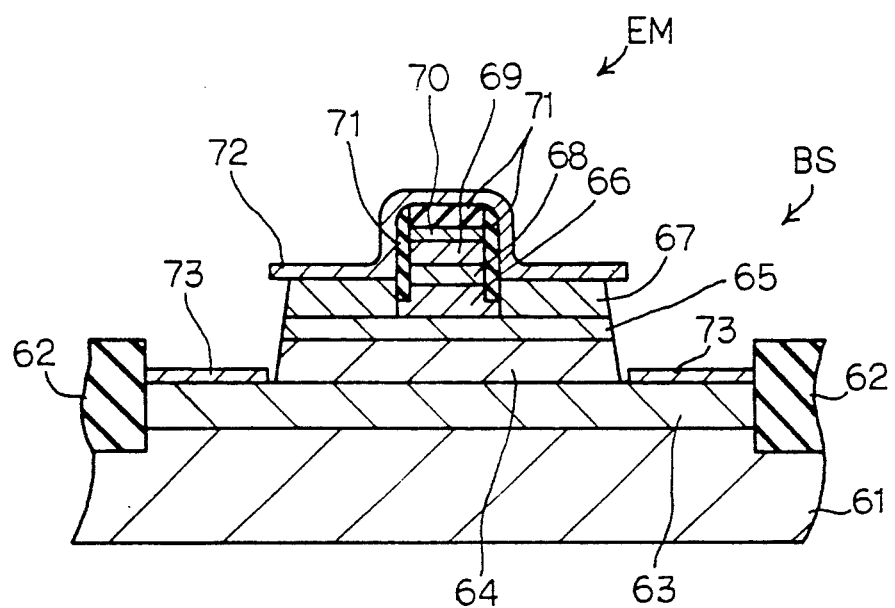
FIG. 10 is a cross sectional view showing the structure of another heterojunction bipolar transistor according to the present invention.

Referring to FIG. 10, another heterojunction bipolar transistor embodying the present invention is fabricated on a semi-insulating substrate 61 of gallium arsenide, and an insulating layer 62 isolates a device area for the heterojunction bipolar transistor. On the semi-insulating substrate 61 is formed a collector contact layer 63 of n-type gallium arsenide which is partially overlain by a collector layer 64 of n-type gallium arsenide in the central zone thereof. On a central zone of the collector layer 64 is stacked a base layer 65 of p-type gallium arsenide which in turn is overlain by an emitter layer 66 of n-type aluminum gallium arsenide represented by the molecular formula of $Al_{0.25}Ga_{0.75}As$. On the peripheral zone of the base layer 65, a base contact layer 67 is formed of p-type gallium arsenide, and the emitter layer 66 is held in contact with the base contact layer 67. However, only the base layer 65 provides a transit path for carriers between the emitter layer 66 and the collector layer 64, and the base contact layer 67 supplies hole current to the emitter layer 66. On the emitter layer 66 is formed a graded layer 68 of n-type aluminum gallium arsenide represented by the molecular formula of $Al_x$-$Ga_{1-x}As$ where x is varied from 0.25 to zero, and an emitter contact layer 69 is formed on the graded layer 68. In this instance, the emitter layer 66, the graded layer 68 and the emitter contact layer 69 as a whole constitute an emitter structure EM, and the base layer 65 and the base contact layer 67 form in combination a base structure BS. An emitter electrode 70 of gold-germanium-nickel is in contact with the emitter contact layer 69, and most of the side surface and the top surface of the emitter structure EM is covered with a silicon dioxide film 71. The silicon dioxide 71 isolates a base electrode 72 of titanium-platinum-gold from the emitter structure EM, and is held in contact with the base contact layer 67. The peripheral zone of the collector contact layer 63 is covered with a collector electrode 73 of gold-germanium-nickel.

Figure 11A:
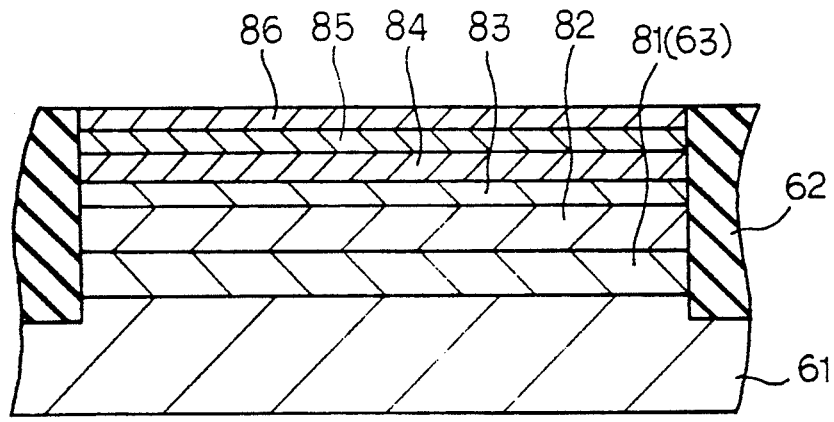
FIGS. 11A to 11E are cross sectional views showing a process sequence for fabricating the heterojunction bipolar transistor shown in FIG. 10.

The heterojunction bipolar transistor implementing the second embodiment is fabricated from a process sequence described hereinbelow with reference to FIGS. 11A to 11E. The process starts with preparation of the semi-insulating substrate 61. On the semi-insulating substrate 61 are successively grown an n-type gallium arsenide film 81 doped with n-type impurity atoms of about $3 \times 10^{18}$ cm$^{-3}$, an n-type gallium arsenide film 82 doped with n-type impurity atoms of about $5 \times 10^{16}$ cm$^{-3}$, a p-type gallium arsenide film 83 doped with beryllium atoms of about $3 \times 10^{19}$ cm$^{-3}$, an n-type aluminum gallium arsenide film ($Al_{0.25}Ga_{0.75}As$) 84 doped with n-type impurity atoms of about $3 \times 10^{17}$ cm$^{-3}$, a graded n-type aluminum gallium arsenide film ($Al_x$-$Ga_{1-x}As$ where x varies from 0.25 to zero from the n-type aluminum gallium arsenide film 84) 85 doped with n-type impurity atoms of about $3 \times 10^{17}$ cm$^{-3}$ and an n-type gallium arsenide film 86 doped with n-type impurity atoms of about $3 \times 10^{18}$ cm$^{-3}$ through a molecular beam epitaxy at about 600 degrees in centigrade, and the n-type gallium arsenide film 81, the n-type gallium arsenide film 82, the p-type gallium arsenide film 83, the n-type aluminum gallium arsenide film 84, the graded n-type aluminum gallium arsenide film 85 and the n-type gallium arsenide film 86 are respectively grown to the thicknesses of 400 nanometer, 400 nanometer, 50 nanometer, 200 nanometer, 50 nanometer and 50 nanometer. After the epitaxial growth, boron ion (B+) is selectively implanted into the semi-insulating substrate 61 and the epitaxially grown layers 81 to 86 so as to produce the insulating layer 62. The n-type gallium arsenide film 81 provides the collector contact layer 63, and the resultant structure of this stage is shown in FIG. 11A.

Figure 11B:
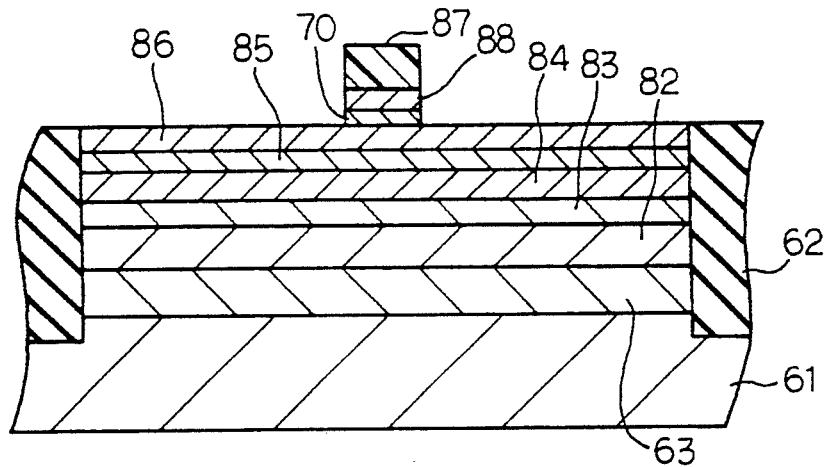

Gold-germanium-nickel is deposited on the entire surface of the structure through an evaporation technique, and a thin silicon dioxide film is deposited on the gold-germanium-nickel film. A photoresist solution is spun onto the silicon dioxide film, and the photoresist film is patterned through a lithographic process. Then, a photoresist mask 87 is left on thin silicon dioxide film, and the silicon dioxide film is, then, etched by using a reactive ion beam etching technique. A silicon dioxide mask 88 is patterned beneath the photoresist mask 87. Subsequently, the gold-germanium-nickel film is selectively etched away by through an ion milling, and the emitter electrode 70 is left beneath the silicon dioxide mask 87 as shown in FIG. 11B.

Figure 11C:
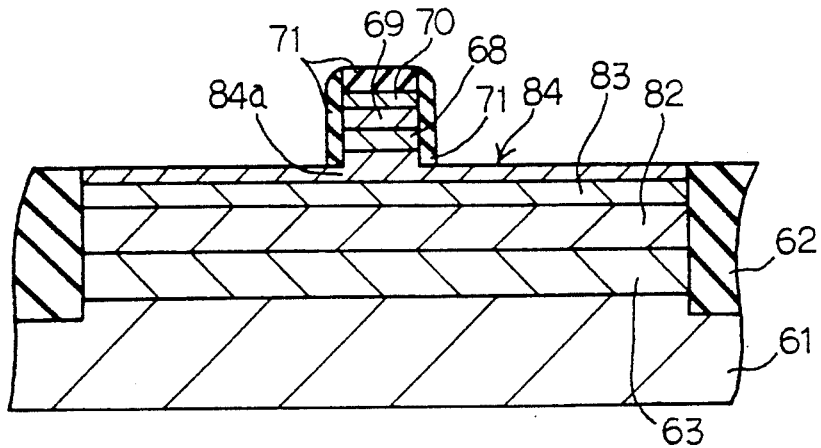

The photoresist mask 87 is removed by using an organic solvent, and the n-type gallium arsenide film 86 and the graded n-type aluminum gallium arsenide film 85 are etched and patterned through a reactive ion etching technique using an etchant containing chlorine ($Cl_2$). The reactive ion etching is continued until the aluminum gallium arsenide film 84 exposed to the etchant is etched to a predetermined thickness. The continuous etching produces a shoulder portion 84a, and the predetermined thickness is of the order of tens nanometer. The n-type gallium arsenide film 86 and the graded n-type aluminum gallium arsenide film 85 thus patterned provide the emitter contact layer 69 and the graded layer 68, respectively Silicon dioxide is deposited over the entire surface of the structure, and a reactive ion beam etching technique using an etchant containing tetrafluoride is applied to the silicon dioxide film. The silicon dioxide film 71 is left on the shoulder portion 84a of the aluminum gallium arsenide film 84, and covers the emitter contact layer 69 and the graded layer 68. It is desirable for the aluminum gallium arsenide film 84 beneath the silicon dioxide film 71 to be completely depleted, and the predetermined thickness of tens nanometer allows the aluminum gallium arsenide film 84 to be completely depleted. The advantages of the complete depletion are described by Hayama et al, Technical Report of Electron Information Communication Society, 1987, ED89147, page 67. The thin aluminum gallium arsenide film 84 beneath the silicon dioxide film 71 is prevented from local increase of resistance. The resultant structure of this stage is shown in FIG. 11C.

Figure 11D:
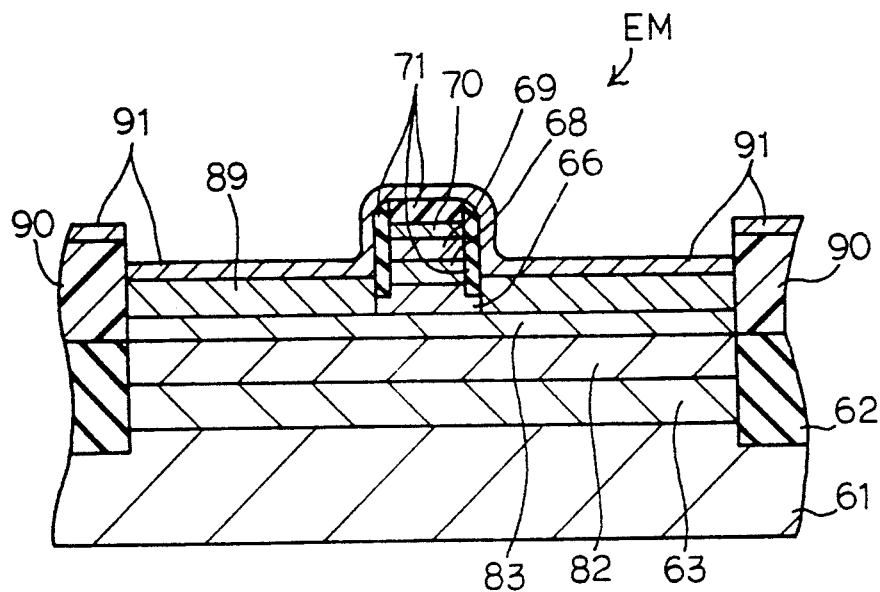

Using the silicon dioxide film 71 as a mask, the n-type aluminum gallium arsenide film 84 is etched and patterned in a water solution of phosphoric acid and hydrogen peroxide until the p-type gallium arsenide film 83 is exposed. The n-type aluminum gallium arsenide film 84 thus patterned provides the emitter layer 66. Using the silicon dioxide film 71 as a mask, a p-type gallium arsenide film 89 is selectively grown on the p-type gallium arsenide film 83 through a molecular beam epitaxy using trimethylgallium ($Ga(CH_3)_3$) and solid arsenic as sources. The p-type gallium arsenide film 89 is doped with carbon, and is grown to about 300 nanometer at about 450 degrees in centigrade. The carbon concentration is as large as $4 \times 10^{20}$ cm$^{-3}$. A photomask is formed so as to cover the device area, and the p-type gallium arsenide film 89 on the insulating layer 62 is etched away. A new photomask 90 is formed on and covers the insulating layer 90. A titanium-platinum-gold film 91 is deposited over the entire surface of the structure as shown in FIG. 11D.

Figure 11E:
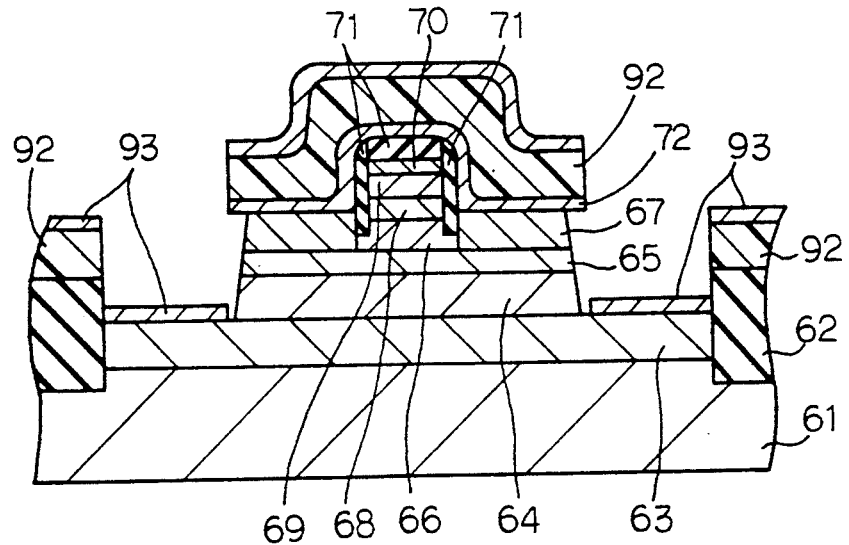

After the deposition of the titanium-platinum-gold film 91, the photomask 90 is stripped off in an organic solvent, and a new photomask 92 is formed on the titanium-platinum-gold film 91. The photomask 92 defines a width of the base electrode 72. Using the photomask 92, the titanium-platinum-gold film is subjected to an ion milling, and the base electrode 72 is left beneath the photomask 92. Subsequently, the p-type gallium arsenide film 89, the p-type gallium arsenide film 83 and the n-type gallium arsenide film 8 2 are exposed to the water solution of phosphoric acid and hydrogen peroxide, and the base c contact layer 67, the base layer 65 and the collector layer 64 are left beneath the base electrode 72. A gold-germanium-nickel film 93 is deposited by using the evaporation technique as shown in FIG. 11E, and the photomask 92 is, then, exposed to the organic solvent. The photomask 92 is stripped off, and the collector electrode 73 is left on the collector contact layer 63.

The heterojunction bipolar transistor implementing the second embodiment is fabricated also through a process sequence described hereinbelow with reference to FIGS. 11A to 11E. The process starts with preparation of the semi-insulating substrate 61. On the semi-insulating substrate 61 are successively grown an n-type gallium arsenide film 81 doped with n-type impurity atoms of about $3\times10^{18}$ cm$^{-3}$, an n-type gallium arsenide film 82 doped with n-type impurity atoms of about $5\times10^{16}$ cm$^{-3}$, a p-type gallium arsenide film 83 doped with carbon atoms of about $6\times10^{19}$ cm$^{-3}$, an n-type aluminum gallium arsenide film (Al$_{0.25}$Ga$_{0.75}$As) 84 doped with n-type impurity atoms of about $3\times10^{17}$ cm$^{-3}$, a graded n-type aluminum gallium arsenide film (Al$_x$Ga$_{1-x}$As where x varies from 0.25 to zero from the n-type aluminum gallium arsenide film 84) 85 doped with n-type impurity atoms of about $3\times10^{17}$ cm$^{-3}$ and an n-type gallium arsenide film 86 doped with n-type impurity atoms of about $3\times10^{18}$ cm$^{-3}$ through metalorganic chemical vapor deposition at about 650 degrees in centigrade except for the p-type gallium arsenide film 83. The p-type gallium arsenide film 83 is grown at about 500 degrees in centigrade. The n-type gallium arsenide film 81, the n-type gallium arsenide film 82, the p-type gallium arsenide film 83, the n-type aluminum gallium arsenide film 84, the graded n-type aluminum gallium arsenide film 85 and the n-type gallium arsenide film 86 are respectively grown to the thicknesses of 400 nanometer, 400 nanometer, 50 nanometer, 200 nanometer, 50 nanometer and 50 nanometer. The other steps forming parts of the process sequence are almost the same as the above-mentioned process sequence for the second embodiment.

The second embodiment also forms the heterojunction between the aluminum gallium arsenide film 84 and the p-type gallium arsenide films 83 and 89. However, various III-V compound semiconductor materials are available for the heterojunction. For example, a base layer may be formed of beryllium or carbon doped aluminum gallium arsenide, and the aluminum content thereof may vary so as to form a graded base. The present invention is further applicable to heterojunction bipolar transistors in the AlInAs/InGaAs system as well as in InP/InGaAs system. In such implementations, the base layers are formed of p-type indium gallium arsenide. P-type aluminum indium gallium arsenide and p-type indium gallium arsenic phosphide are also available for the base layer.

Since the base contact layer 67 decreases the base contact resistance, the total base resistance is also decreased by virtue of the base contact layer 67. The low resistive base structure allows decreasing the thickness of the base layer 65, and not only the maximum oscillation frequency but also the cut-off frequency are improved. Furthermore, since the base contact layer 67 is provided on the base layer 65, the heterojunction bipolar transistor is free from an undesirable increase in base resistance due to an over-etched base layer at patterning the emitter layer 66, and transistor characteristics are stable because of reproducible dimensions.

Although particular embodiments of the present invention have been shown and described, it will be obvious to those skilled in the art that various changes and modifications may be made without departing from the spirit and scope of the present invention. The primary and secondary base layers of the above described embodiments are substantially perpendicular to the emitter-base heterojunction. However, primary and secondary base layers may be held in contact with the emitter-base heterojunction at an acute angle. Moreover, a base layer and a collector layer may be stacked on an emitter layer.

What is claimed is:

1. A heterojunction bipolar transistor fabricated on a semi-insulating substrate; said transistor comprising:
    a) an emitter structure having an emitter layer formed of an n-type first compound semiconductor material, and an emitter electrode electrically coupled with said emitter layer;
    b) a base structure held in contact with said emitter layer for forming an emitter-base heterojunction; and
    c) a collector layer formed of an n-type second compound semiconductor material electrically connected with a collector electrode and held in contact with said base structure for forming a base-collector junction, wherein said base structure has a first region formed of a p-type III-V compound semiconductor material, and a second region held in direct contact with a base electrode and formed of a carbon-doped gallium arsenide which is equal to or larger in hole density than said p-type III-V compound semiconductor material, said first and second regions providing a transit path for carriers supplied to said base structure, said p-type III-V compound semiconductor material containing at least one Group III element selected from the group consisting of gallium, aluminum and indium, and at least one Group V element selected from the group consisting of arsenic and phosphorus, said p-type III-V compound semiconductor material being not greater in band gap than said carbon-doped gallium arsenide.

2. A heterojunction bipolar transistor as set forth in claim 1, in which said first and second regions respectively serve as a primary base located in a central zone of said base structure, and a secondary base located in a peripheral zone of said base structure, both of said first and second regions being exposed to said base-collector junction.

3. A heterojunction bipolar transistor as set forth in claim 2, in which said primary base layer and said secondary base layer are formed of beryllium-doped gallium arsenide and carbon-doped gallium arsenide, respectively.

4. A heterojunction bipolar transistor as set forth in claim 3, in which said impurity concentration of said primary base layer is equal to or less than $5\times10^{19}$ cm$^{-3}$, and in which said impurity concentration of said secondary base layer is equal to or less than $10^{21}$ cm$^{-3}$.

5. A heterojunction bipolar transistor as set forth in claim 1, in which said first region serves as a base layer exposed to said emitter-base region serves as a base layer exposed to said emitter-base heterojunction and to said base-collector junction, and in which said second region serves as a base contact layer held in contact with said base layer and a base electrode.

6. A heterojunction bipolar transistor as set forth in claim 5, in which said base layer and said base contact layer are formed of beryllium-doped gallium arsenide and carbon-doped gallium arsenide, respectively.

7. A heterojunction bipolar transistor as set forth in claim 6, in which said impurity concentration of said base layer is equal to or less than $5\times10^{19}$ cm$^{-3}$, and in which said impurity concentration of said base contact layer is equal to or less than $10^{21}$ cm$^{-3}$.

8. A heterojunction bipolar transistor fabricated on a semi-insulating substrate, said transistor comprising:
a) an emitter structure having an emitter layer formed of an n-type first compound semiconductor material;
b) a base structure held in contact with said emitter layer for forming an emitter-base heterojunction; and
c) a collector layer formed of an n-type second compound semiconductor material and held in contact with said base structure for forming a base-collector junction, wherein said base structure has a first region formed of beryllium-doped gallium arsenide, and a second region formed of carbon-doped gallium arsenide having a hole density which is equal to or larger than a hole density of said beryllium-doped gallium arsenide, said first and second regions providing a transit path for carriers supplied to said base structure, said first and second regions respectively serving as a primary base layer located in a central zone of said base structure and a secondary base layer, both of said first and second regions being exposed to said base-collector junction, said primary and secondary base layers being doped with beryllium of about $3 \times 10^{19}$ cm$^{-3}$ and carbon of about $4 \times 10^{20}$ cm$^{-3}$, respectively.

9. A heterojunction bipolar transistor as set forth in claim 8, in which said primary base layer is about 40 nanometer in thickness, and in which said secondary base layer is about 300 nanometer thickness.

10. A heterojunction bipolar transistor as set forth in claim 9, in which said emitter layer has a central portion and a peripheral portion which is thinner than said central portion so that there is a shoulder portion for allowing a side surface of said peripheral portion to be held in contact with said secondary base layer, and in which said emitter structure is covered with an insulating film terminated at said shoulder portion, said shoulder portion being held to a predetermined thickness so as to be completely depleted.

11. A heterojunction bipolar transistor as set forth in claim 10, in which said emitter layer is formed of aluminum gallium arsenide having a predetermined aluminum content, and in which said emitter structure further has an n-type graded layer of aluminum gallium arsenide having aluminum content varied from said predetermined aluminum content to zero, and an emitter contact layer of n-layer gallium arsenide coupled to an emitter electrode, wherein said collector layer is formed on an n-type collector contact layer and of n-type gallium arsenide, a base electrode and a collector electrode being provided on said secondary base layer and said collector contact layer, respectively.

12. A heterojunction bipolar transistor fabricated on a semi-conductor substrate; said transistor comprising:
a) an emitter structure having an emitter layer formed of an n-type first compound semiconductor material;
b) a base structure held in contact with said emitter layer for forming an emitter-base heterojunction; and
c) a collector layer formed of an n-type second compound semiconductor material and held in contact with said base structure for forming a base-collector junction, wherein said base structure has a first region serving as a base layer and formed of beryllium-doped gallium arsenide, and a second region serving as a base contact layer and formed of carbon-doped gallium arsenide having a hole density which is equal to or larger than a hole density in said p-type III-V compound semiconductor material, said first and second regions providing a transit path for carriers supplied to said base structure, said base layer being exposed to said emitter-base heterojunction and to said base-collector junction, said base contact layer being held in contact with said base layer and a base electrode, said base layer and said base contact layer being doped with beryllium of about $3 \times 10^{19}$ cm$^{-3}$ and carbon of about $4 \times 10^{20}$ cm$^{-3}$, respectively.

13. A heterojunction bipolar transistor as set forth in claim 12, in which said base layer is about 50 nanometer in thickness, and in which said base contact layer is about 300 nanometer in thickness.

14. A heterojunction bipolar transistor as set forth in claim 13, in which said emitter layer has a central portion and a peripheral portion which is thinner than said central portion to produce a shoulder portion for allowing a side surface of said peripheral portion to be held in contact with said secondary base layer, and in which said emitter structure is covered with an insulating film terminated at said shoulder portion, said shoulder portion being a predetermined thickness so as to be completely depleted.

15. A heterojunction bipolar transistor as set forth in claim 14, in which said emitter layer is formed of aluminum gallium arsenide having a predetermined aluminum content, and in which said emitter structure further has an n-type graded layer of aluminum gallium arsenide having aluminum content varied from said predetermined aluminum content to zero, and an emitter contact layer of n-type gallium arsenide coupled to an emitter electrode, wherein said collector layer is formed on a collector contact layer and of n-type gallium arsenide, a base electrode and a collector electrode being provided on said base contact layer and said collector contact layer, respectively.

16. A heterojunction bipolar transistor fabricated on a semi-insulating substrate, said transistor comprising:
a) an n-type collector layer formed on said semi-insulating substrate and having a thick central portion and a thin peripheral portion;
b) a p-type primary base layer formed of gallium arsenide and on said thick central portion of said n-type collector;
c) a p-type secondary base layer formed on said thin peripheral portion of said n-type collector layer and of carbon-doped gallium arsenide so as to have a band gap width which is equal to the band gap width of said primary base layer;
d) an n-type emitter structure formed on said p-type primary base layer and having a side surface held in contact with an inner peripheral surface of said p-type secondary base layer, said n-type emitter structure having a predetermined compound semiconductor layer for forming a potential barrier with said gallium arsenide against electrons in said p-type primary base layer;
e) an emitter electrode held in contact with said emitter structure;
f) a base electrode held in direct contact with said p-type secondary base layer, said p-type secondary base layer having a hole concentration which is larger than the hole concentration of said p-type primary base layer for decreasing a base contact resistance with said base electrode; and g) an insulating film structure covering said n-type emitter structure and said emitter electrode, and partially embedded into said p-type primary base layer for substantially perfectly isolating said base electrode from said emitter electrode and said n-type emitter structure.

17. A heterojunction bipolar transistor fabricated on a semi-insulating substrate, comprising:
   a) an n-type collector structure formed on said semi-insulating substrate;
   b) a p-type base layer of gallium arsenide formed of a central zone of said n-type collector structure, and having a central area and an outer peripheral area;
   c) an n-type emitter structure formed on said central area of said p-type base layer, and having a thick central portion and a thin outer peripheral portion, said n-type emitter structure having a predetermined compound semiconductor layer for forming a potential barrier with said gallium arsenide against electrons in said p-type base layer;
   d) an emitter electrode held in contact with said thick central portion of said n-type emitter structure;
   e) an insulating film covering said thick central portion and said emitter electrode;
   f) a p-type base contact layer formed on said outer peripheral area of said p-type base layer and of carbon-doped gallium arsenide so as to have a band gap width which is equal to the band gap width of said p-type base layer, and held in contact with a side surface of said thin outer peripheral portion of said emitter structure; and
   g) a base electrode held in direct contact with an upper surface of said p-type base contact layer, and isolated from said n-type emitter structure and said emitter electrode, said base contact layer having a hole concentration which is larger than the hole concentration of said base layer for decreasing a base contact resistance with said base electrode.

* * * * *